United States Patent
Matsuoka

(10) Patent No.: US 8,350,322 B2
(45) Date of Patent: Jan. 8, 2013

(54) SEMICONDUCTOR DEVICE AND METHOD FOR MANUFACTURING THE SAME

(75) Inventor: Takeru Matsuoka, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 74 days.

(21) Appl. No.: 12/885,395

(22) Filed: Sep. 17, 2010

(65) Prior Publication Data

US 2011/0108911 A1     May 12, 2011

(30) Foreign Application Priority Data

Nov. 6, 2009   (JP) .................................. 2009-255078

(51) Int. Cl.
    *H01L 29/76*      (2006.01)
    *H01L 21/336*     (2006.01)

(52) U.S. Cl. . 257/330; 257/331; 257/341; 257/E29.262; 257/E21.41; 257/E21.418; 438/259; 438/268; 438/270

(58) Field of Classification Search .................. 257/330, 257/331, 341, 342, E29.262, E21.41, E21.418, 257/E21.419; 438/259, 270, 271, 268
See application file for complete search history.

(56) References Cited

U.S. PATENT DOCUMENTS

2011/0291185 A1*   12/2011   Grover .......................... 257/334

FOREIGN PATENT DOCUMENTS

| JP | 2003-086801 | 3/2003 |
| JP | 2004-281524 | 10/2004 |

* cited by examiner

*Primary Examiner* — Hsien Ming Lee
(74) *Attorney, Agent, or Firm* — Patterson & Sheridan, LLP

(57) ABSTRACT

According to one embodiment, a semiconductor device includes a first and a second semiconductor layer of a first conductivity type, a third semiconductor layer of a second conductivity type, a source region of the first conductivity type, a first and a second main electrode, trench gates, a first and a second contact region. The third semiconductor layer is provided on the second semiconductor layer provided on the first semiconductor layer. The first main electrode is electrically connected to the first semiconductor layer. The second main electrode is electrically connected to the source region provided on the third semiconductor layer. The trench gates are provided from the third semiconductor layer to the second semiconductor layer. The first and second contact regions electrically connect the second main electrode and the third semiconductor layer. An opening area of the second contact hole is smaller than that of the first contact hole.

20 Claims, 9 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from the prior Japanese Patent Application No. 2009-255078, filed on Nov. 6, 2009; the entire contents of which are incorporated herein by reference.

FIELD

Embodiments described herein relate generally to a semiconductor device and a method for manufacturing the same.

BACKGROUND

In power semiconductor devices used for controlling electrical power, continuing efforts have been made to reduce on-resistance in order to reduce power losses during switching operations. For example, by using a trench gate as a gate structure, channel density can be increased in comparison to a gate with a planar structure. Furthermore, by further miniaturizing element structures, it is possible to greatly reduce the on-resistance.

On the other hand, in power semiconductor devices with low breakdown voltages, such as the power MOSFET, the need for fast operation for applications in switching power supplies and DC-DC converters continues to grow. In this case, elements that are not destroyed by surge voltages with narrow pulse widths that occur during high-speed switching are desired.

To respond to these needs, there is a need for a semiconductor device with a high withstand capability for avalanche breakdown. Thus, it is desirable to increase the breakdown voltage at the termination portions, and especially at corner portions, where the electric field distribution is asymmetric and electric field concentrations easily occur.

DETAILED DESCRIPTION

Figure 1A:
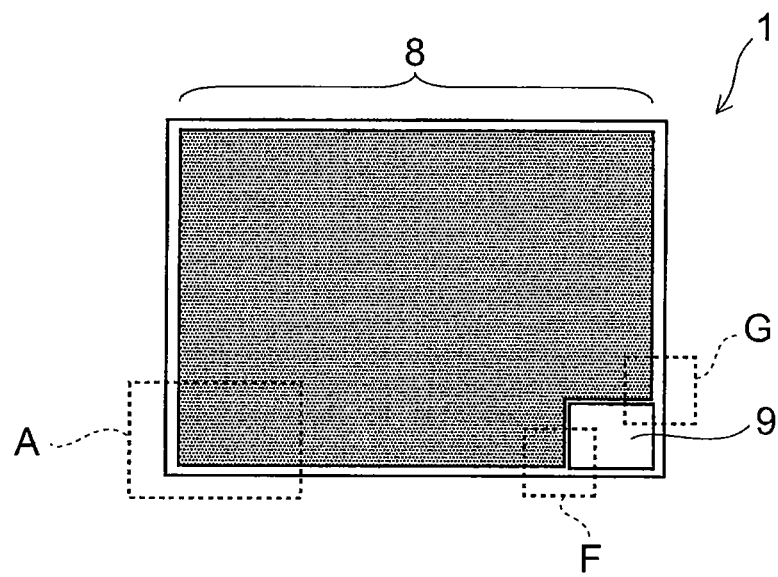
FIGS. 1A and 1B are schematic views illustrating a semiconductor device according to a first embodiment of the invention.

In general, according to one embodiment, a semiconductor device includes a first semiconductor layer of a first conductivity type, a second semiconductor layer of the first conductivity type, a third semiconductor layer of a second conductivity type, a source region of the first conductivity type, a first main electrode, a second main electrode, trench gates, a first contact region and a second contact region. The second semiconductor layer is provided on a first major surface of the first semiconductor layer. The third semiconductor layer is provided on the second semiconductor layer. The source region is provided on a surface of the third semiconductor layer. The first main electrode is electrically connected to a second major surface of the first semiconductor layer. The second main electrode is electrically connected to the source region. The trench gates partition a plurality of unit cells provided in a cell region where a main current flows in a vertical direction between the first main electrode and the second main electrode via the source region, and are provided so as to reach from the surface of the third semiconductor layer to the second semiconductor layer. The first contact region contains an impurity of the second conductivity type ion implanted at a bottom of each of a plurality of first contact holes formed in the third semiconductor layer at a central portion of each of the plurality of unit cells, and electrically connects the second main electrode and the third semiconductor layer. The second contact region contains an impurity of the second conductivity type ion implanted at a bottom of each of a plurality of second contact holes formed in the third semiconductor layer in a termination region provided surrounding the cell region, and electrically connects the second main electrode and the third semiconductor layer. An opening area of each of the second contact holes is smaller than an opening area of each of the first contact holes.

Embodiments of the invention will now be described with reference to the drawings. Note that, in the following description, a silicon power MOSFET for use in power control is given as an example of a semiconductor device. Components that are identical in the drawings are labeled with the same numerals and detailed descriptions of these components are omitted when appropriate. Differing components are described.

First Embodiment

Figure 1B:
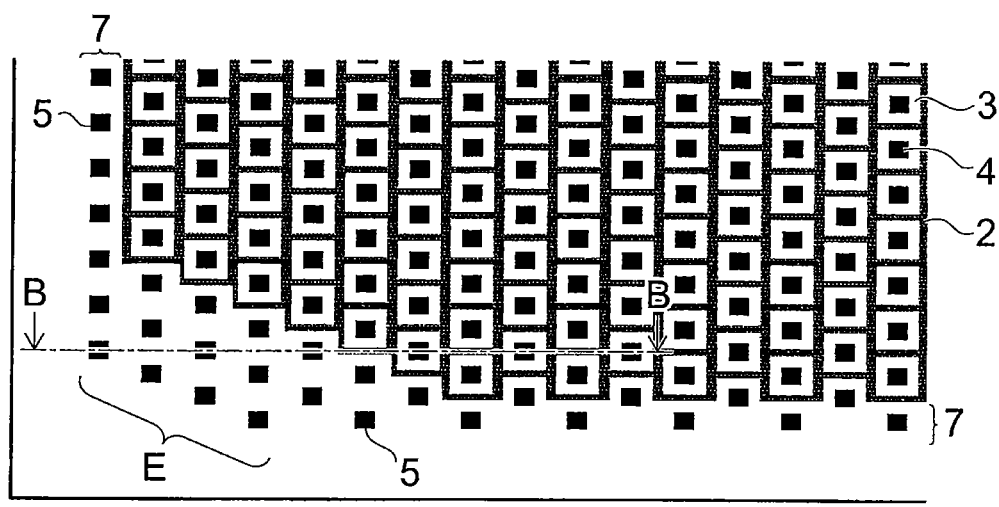
Figure 7A:
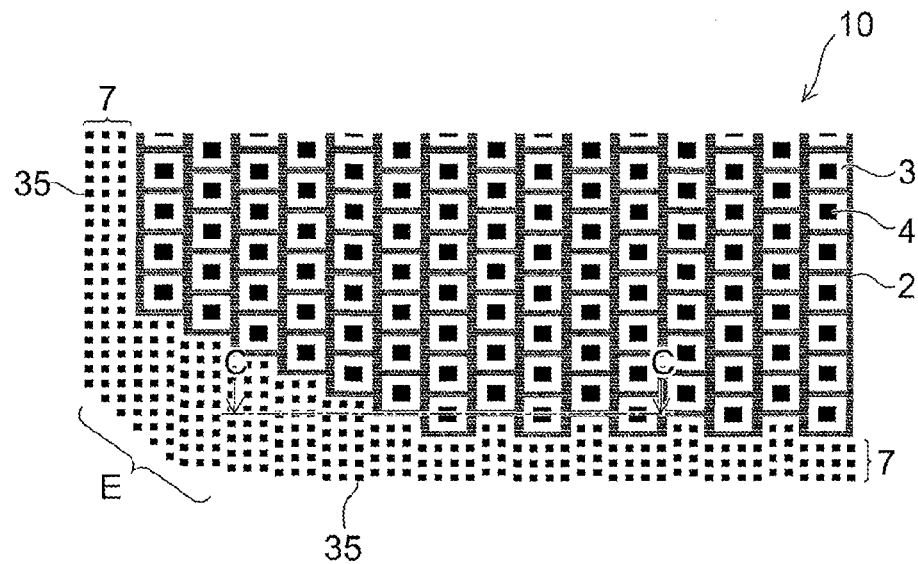
FIGS. 7A and 7B are schematic views illustrating a semiconductor device according to a second embodiment.
Figure 8A:
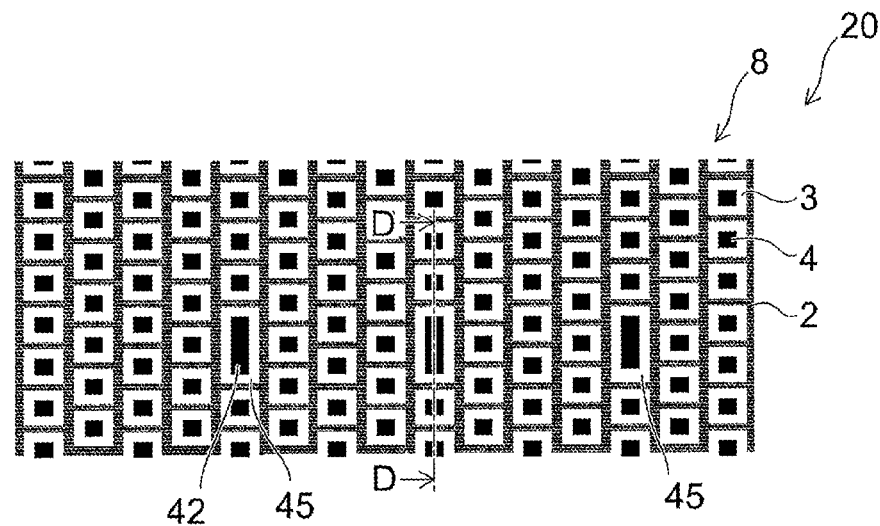
FIGS. 8A and 8B are schematic views illustrating a semiconductor device according to a third embodiment.

FIGS. 1A and 1B are schematic views illustrating a power MOSFET 1 according to the first embodiment. Note, however, that a surface without a source electrode is schematically illustrated in FIGS. 1A and 1B. In the following description, FIG. 7A and FIG. 8A are of the same type. The power MOSFET 1 is described as an n-channel type MOSFET, however may be a p-channel type MOSFET.

FIG. 1A is a plan view schematically illustrating a major surface (chip surface) of the power MOSFET 1. A center of the chip surface is provided with a cell region 8 having a plurality of MOSFET unit cells disposed therein. Also, a gate pad 9 is disposed at the bottom-right corner in the drawing.

FIG. 1B is an enlarged schematic view illustrating the cell disposition in a region A that is indicated by the broken line in FIG. 1A. Unit cells 3 disposed in the cell region 8 are partitioned by trench gates 2. Also, first contact holes 4 are provided at a center of each of the unit cells 3.

On the other hand, in a termination region 7 (region where the trench gates 2 are not provided) that surrounds the cell region 8, second contact holes 5 are provided at, for instance, the same interval as the cell region 8. Furthermore, a width of the termination region 7 adjacent to a corner portion E of the cell region 8 that projects outwardly from the cell region 8 is provided to be large. Accordingly, as illustrated in FIG. 1B, the number of the second contact holes 5 in the termination region 7 adjacent to the corner portion E of the cell region 8 is larger than the number of the second contact holes 5 provided in the termination region 7 adjacent to portions of the cell region 8 other than the corner portion E.

More specifically, in the termination region 7, regarding to the number of the second contact holes 5 (the number per unit length of the boundary between the cell region 8 and the termination region 7) in a direction perpendicular to the boundary between the cell region 8 and the termination region 7, the number of the second contact holes 5 adjacent to the corner portion E of the cell region 8 is larger than the number of the second contact holes 5 adjacent to a portion other than the corner portion of the cell region 8.

Here, the first contact holes 4 and the second contact holes 5 are distinguished by being provided in different sites. Specifically, the first contact holes 4 are provided in the cell region 8 and the second contact holes 5 are provided in the termination region 7. Moreover, in the following description too, the "first contact region" is provided in the cell region 8 and the "second contact region" is provided in the termination region 7.

To enhance an avalanche withstand capability of the MOS-FET, it is desirable to use a design in which a breakdown at turnoff does not concentrate in specific locations of elements. The reason for this is that when the breakdown occurs locally, an avalanche current is concentrated in that location, and there is a high risk that the element will be destroyed. Hence, it is desirable to use a design having robust structures distributing the locations where electric field breakdowns are likely to occur over a plurality of locations within the chip surface.

It is desirable to enhance the breakdown voltage of the termination region 7 where symmetry of the electric field distribution is lost and electric field concentration easily occurs. In the outwardly protruding corner portion E of the cell region 8, in particular, there is a strong tendency for electric field concentrations to occur, therefore it is desirable that the withstand capability is enhanced. It is desirable to enhance the breakdown voltages in the F-region and G-region illustrated in FIG. 1A in the same way that the A-region illustrated in FIG. 1B is enhanced.

In the MOSFET 1 according to this embodiment, as illustrated in FIG. 1B, the avalanche withstand capability of termination portions can be enhanced by providing second contact holes 5 in the termination region 7 having the same size as the first contact holes 4 that are provided in the cell region 8. Furthermore, numerous second contact holes 5 can be provided by increasing the width the termination region 7 at portions adjacent to the corner portion E of the cell region 8 to a greater width than at other portions. Accordingly, contact resistance at portions adjacent to the corner portion E is reduced, and the avalanche withstand capability is enhanced.

As described later, by using hole contacts as a contact structure of the termination region 7, it is possible to make a depth of ion implanting the same as, or shallower than that of the cell region 8 and prevent a loss of avalanche withstand capability of the termination region 7. Furthermore, the contact resistance can be reduced by providing numerous second contact holes 5 in the portion adjacent to the corner portion E. Accordingly, the discharge of electrons generated in high-electric field regions is smoothed, and the avalanche withstand capability can be further enhanced.

For instance, photolithography can be used to narrow a pitch between the second contact holes 5 in the termination region 7 to the limit that the shape of the resist pattern can be maintained. Accordingly, the contact resistance of the termination region 7 can be kept to a minimum, and the avalanche withstand capability can be further enhanced. This pitch minimization can be achieved by optimizing mask dimensions using optical simulation and process simulation or device simulation.

Figure 2:
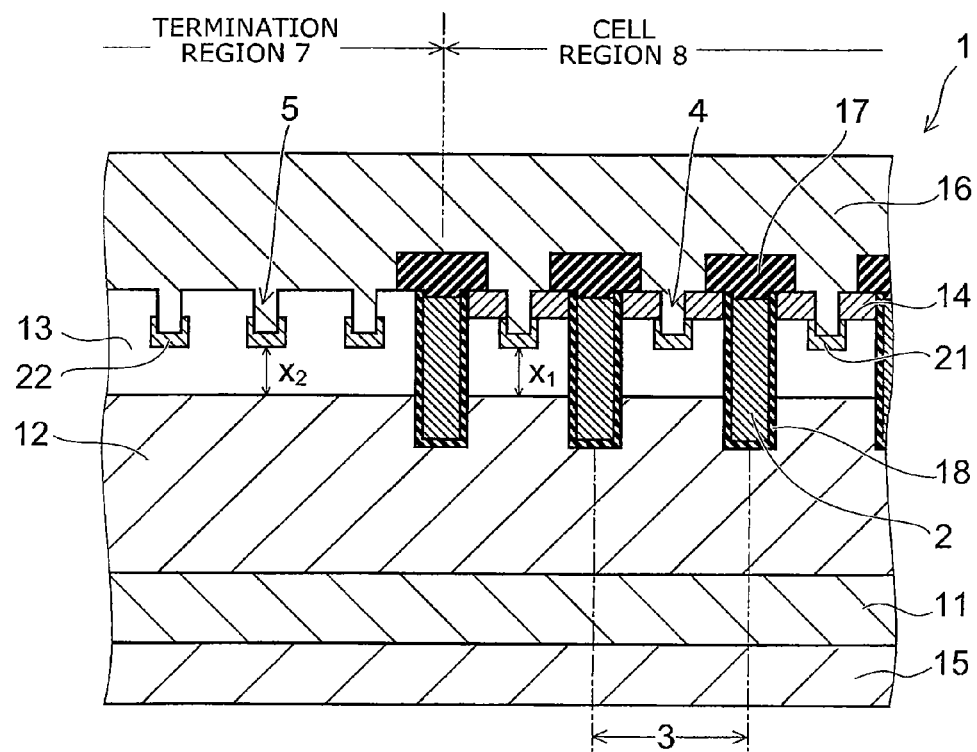
FIG. 2 is a schematic view illustrating a cross-section of the semiconductor device according to the first embodiment.

FIG. 2 is a schematic view illustrating a cross-section of the MOSFET 1 according to the first embodiment. The cross-section illustrated in FIG. 1B is a cross-section taken along the line B-B shown in FIG. 1B. In the following description, n-type corresponds to a first conductivity type and p-type corresponds to a second conductivity type. This correspondence is the same in following embodiments as well.

The MOS-FET 1 according to this embodiment includes a drain layer 11 that is an n-type first semiconductor layer, and a drift layer 12 that is an n-type second semiconductor layer provided on a first major surface of the drain layer 11. A base layer 13 which is a p-type third semiconductor layer is provided on top of the drift layer 12. Furthermore, an n-type source region 14 is provided on a surface of the p-type base layer 13.

Furthermore, a drain electrode 15, which is a first main electrode, is provided electrically connected to a second major surface of the n-type drain layer 11, and a source electrode 16, which is a second main electrode, is provided electrically connected to the n-type source region 14.

As illustrated in FIG. 2, the n-type source region 14 is provided between the drain electrode 15 and the source electrode 16 in the cell region 8, where the main current flows vertically. The cell region 8 is provided with the trench gates 2 that reach from a surface of the n-type source region 14 to the n-type drift layer 12 and a plurality of unit cells 3 partitioned by the trench gates 2 (see FIG. 1B).

Furthermore, the first contact holes 4 are provided in the base layer 13 at a central portion of each of the plurality of unit cells 3. A first contact region 21 with p-type impurities ion implanted therein is provided at the bottoms of the first contact holes 4. The first contact region 21 is electrically connected to the source electrode 16 and the p-type base layer 13.

On the other hand, the plurality of second contact holes 5 are formed in the base layer 13 of the termination region provided around the cell region 8. A second contact region 22 with p-type impurities ion implanted therein is provided at the bottoms of the second contact holes 5, in the same manner that the first contact holes 4 provided in the cell region 8. The second contact region 22 is also electrically connected to the source electrode 16 and the p-type base layer 13.

In the MOS-FET 1 according to this embodiment, the second contact holes 5 are provided so as to have an opening area equivalent to that of the first contact holes 4. Accordingly, an interval X1 between the n-type drift layer 12 and the first contact region 21 and an interval X2 between the n-type drift layer 12 and the second contact region 22 are identical. In other words, the interval X1 between a PN junction that is a boundary between the p-type base layer 13 and the n-type drift layer 12, and the first contact region 21 is identical to the interval X2 between the second contact region 22 and the PN junction.

According to the knowledge of the inventors, the depth in the n-type drain layer 11 direction of the first contact region 21 and the second contact region 22 formed by ion implantation with p-type impurities changes depending on the opening area of each contact hole. For example, if the opening area of the first contact holes 4 is made larger than the opening area of the second contact holes 5, the interval X1 between the first contact region 21 and the PN junction will be narrower that the interval X2 between the second contact region 22 the PN junction.

On the other hand, a maximum value of the electric field distribution in a direction from the first contact region 21 or the second contact region 22 toward the n-type drain layer 11 increases as the intervals X1 and X2 between the PN junction and the contact regions are narrowed. Thus, when the intervals between the PN junction and the contact regions are narrowed, it is easier for avalanche breakdown to occur, and there is a tendency for the avalanche withstand capability to drop.

Figure 9:
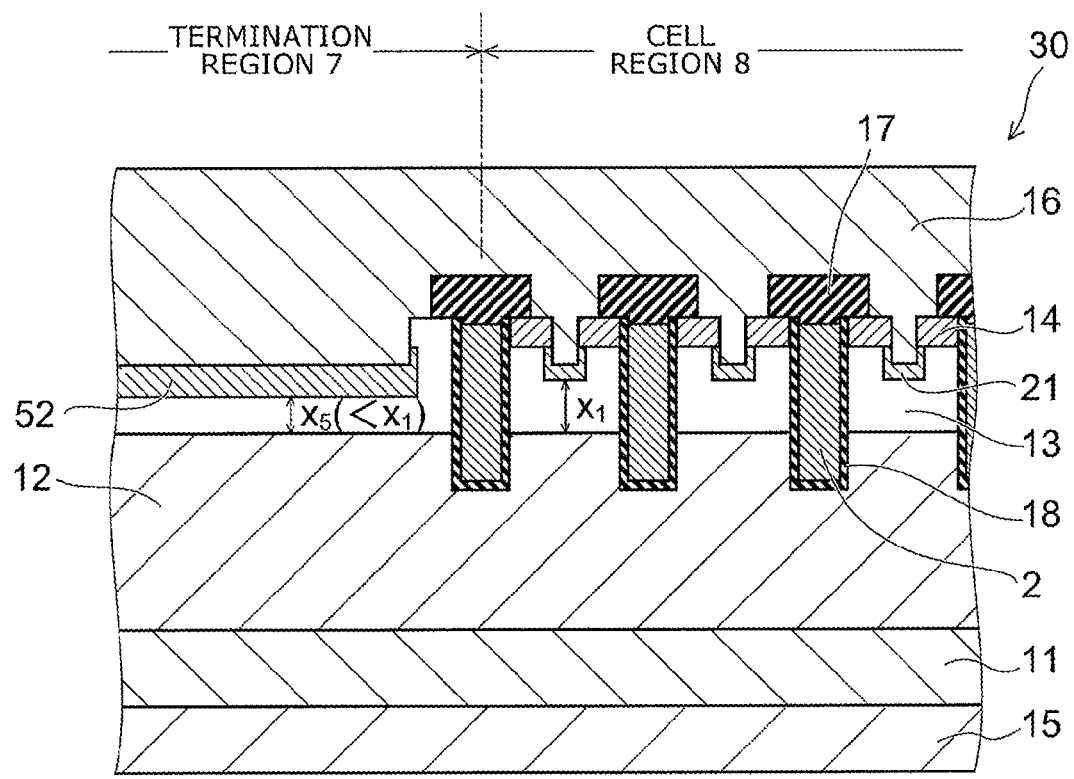
FIG. 9 is a schematic view illustrating a cross-section of a semiconductor device according to a comparative example.

FIG. 9 is a schematic view illustrating a cross-section a MOS-FET 30 according to a comparative example. In the MOS-FET 30 of the comparative example, a contact region 52 is formed by etching a wide area of the termination region 7, as illustrated in FIG. 9. Thus, the p-type impurities of the contact region 52 are deeply ion implanted, and there is a tendency for an interval X5 with the PN junction to become narrower than the interval X1 between the first contact region 21 and the PN junction provided in the cell region 8.

As a result, there is a tendency for the avalanche withstand capability of the termination region 7 to drop below the avalanche withstand capability of the cell region 8. In particular, there is a tendency for the avalanche withstand capability to drop easily at the corner portion E where electric field concentration occurs easily.

In the MOS-FET 1 according to this embodiment, in contrast, the second contact holes 5 are provided in the termination region 7, and the interval X2 between the second contact region 22 and the PN junction is set so as not to be narrower than the interval X1 between the first contact region 21 and the PN junction.

In the MOS-FET 1 according to this embodiment, the first contact holes 4 and the second contact holes 5 are provided having the same opening area so that X1 and X2 are equivalent. However, the opening area of the first contact holes 4 may be made larger than the opening area of the second contact holes 5, so that X1 is narrower than X2. Accordingly, it is possible to make the avalanche withstand capability of the termination region 7 higher than that of the cell region 8.

FIGS. 3A to 6B are cross-sectional views schematically illustrating manufacturing processes of the MOS-FET 1 according to the first embodiment. The cross-sections illustrated in FIGS. 3A to 6B are cross-sections taken along the line B-B shown in FIG. 1B. The MOS-FET 1 of the example is a silicon MOS-FET which uses silicon as a material.

Figure 3A:
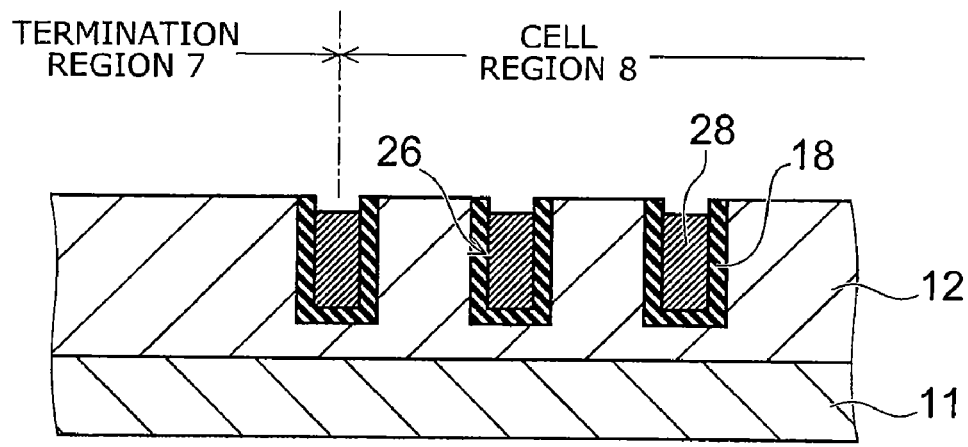
FIGS. 3A to 6B are views schematically illustrating manufacturing processes of the semiconductor device according to the first embodiment.

As illustrated in FIG. 3A, trenches 26 are formed in the n-type drift layer 12 that was epitaxially grown on the first major surface of the n-type drain layer 11, and filled with a conductive polysilicon 28 that forms a gate electrode. The polysilicon 28 is formed using a CVD method over an entire surface of the n-type drift layer 12 where the trenches 26 are formed. Thereafter, etching is performed to remove the polysilicon 28 except for portions remaining in the trenches 26.

For the n-type drain layer 11, a highly concentrated silicon layer epitaxially grown on a silicon substrate, or a heavily doped silicon substrate can be used. Additionally, a silicon oxide film $SiO_2$, which is to become a gate insulating film 18, is formed on internal surfaces of the trenches 26.

Figure 3B:
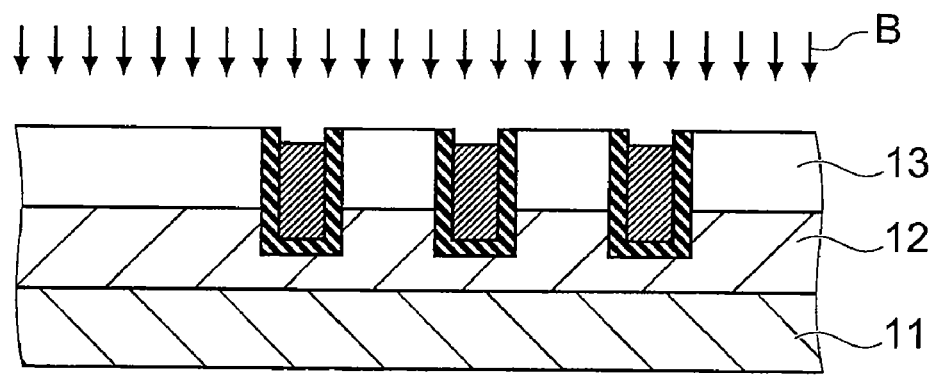

Next, as illustrated in FIG. 3B, p-type impurities are ion implanted in the surface of the n-type drift layer 12 to form the P-type base layer 13. For the p-type impurities, boron (B) can, for instance, be used. Moreover, by heat treatment of the silicon substrate after the ion implantation, the p-type impurities are caused to diffuse to a predetermined depth from the surface of the n-type drift layer 12. Accordingly, the p-type base layer 13 illustrated in FIG. 3B is formed.

Figure 4A:
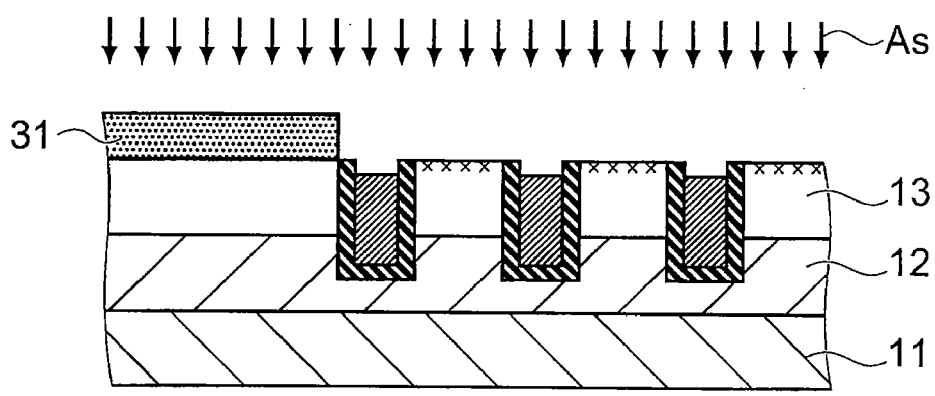

Next, as illustrated in FIG. 4A, n-type impurities, such as arsenic (As), are ion implanted in the surface of the p-type base layer 13 to form an n-type source region. At this time, a photoresist can be used as an implantation mask 31 for performing selective implantation.

Figure 4B:
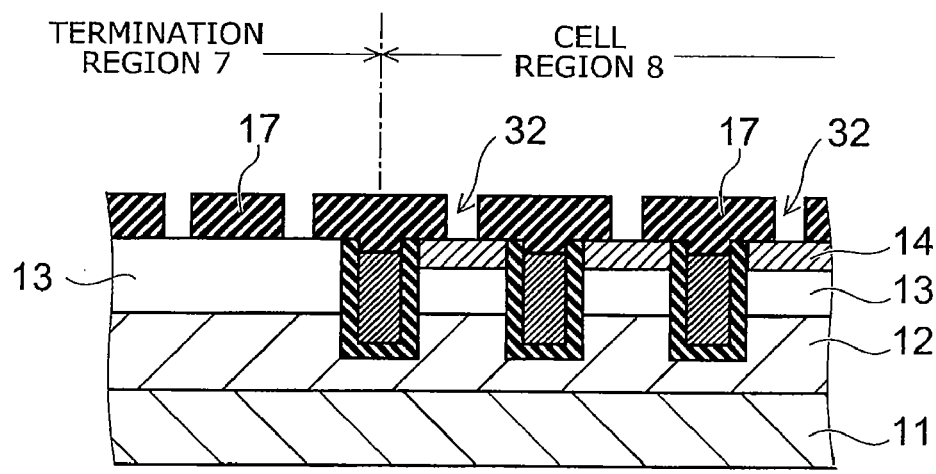

Furthermore, as illustrated in FIG. 4B, an interlayer insulating film 17 is formed on the surfaces of the p-type base layer 13, the n-type source region 14, and the polysilicon 28.

Note that the n-type impurities implanted in the n-type source region 14 can be activated by heat treatment performed in the process of forming the interlayer insulating film 17. Also, in the interlayer insulating film 17, openings 32 are formed for forming the first contact holes 4 and the second contact holes 5.

Figure 5A:
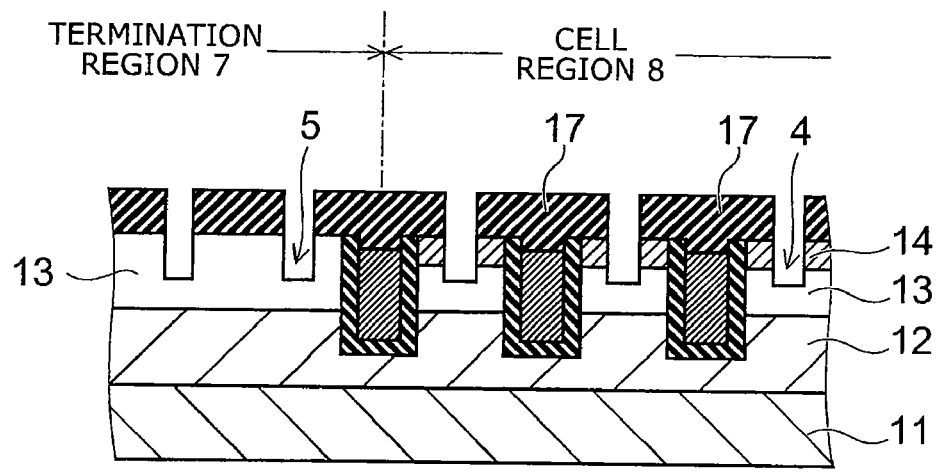
Figure 5B:
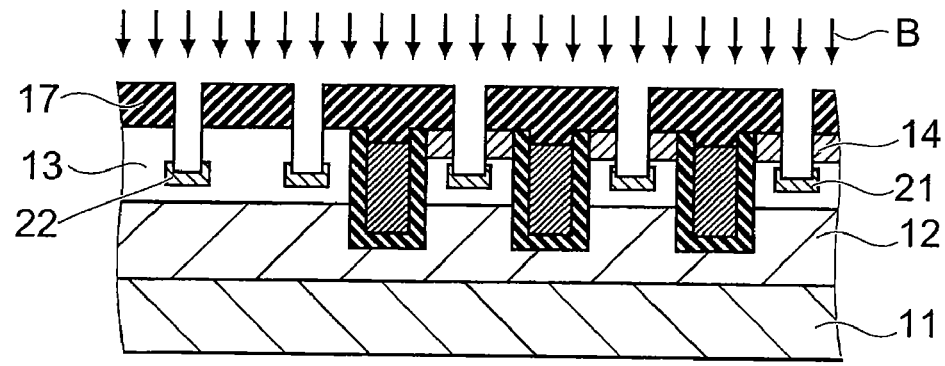

Next, as illustrated in FIG. 5A, the surfaces of the n-type source region 14 and the p-type base layer 13 are dry etched, with the interlayer insulating film 17 having the openings 32 as a mask, to form the first contact holes 4 and the second contact holes 5. Reactive ion etching (RIE) can be used as the dry etching method. Also, the dry etching is performed until the first contact holes 4 formed in the cell region 8 penetrate the n-type source region 14 to communicate with the p-type base layer 13.

Next, with the interlayer insulating film 17 as an implantation mask, p-type impurities, such as boron (B) are ion implanted. The p-type impurities are simultaneously ion-implanted into both bottoms of the first contact holes 4 and bottoms of the second contact holes 5 to form the first contact region 21 and the second contact region 22.

At this time, the first contact region 21 and the second contact region 22 formed by ion implantation in the cell region 8 and the termination region 7 can be formed to be different in depths by changing the opening area of the openings 32 provided in the interlayer insulating film 17. Specifically, by simply changing the design of the photomask used when forming the openings 32 in the interlayer insulating film 17, the depths of the first contact region 21 and the second contact region 22 can be changed without altering the manufacturing process. Accordingly, as described above, it is possible to make the avalanche withstand capability in the termination region 7 the same as or higher than that in the cell region 8.

Figure 6A:
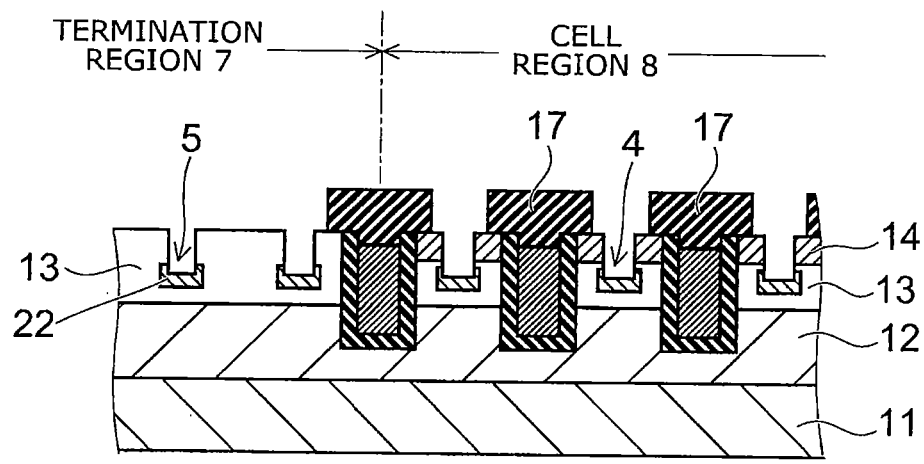

Next, as illustrated in FIG. 6A, a predetermined amount of the surface of the interlayer insulating film 17 is etched, to expose a portion of the surface of the n-type source region 14. Also, the interlayer insulating film 17 formed in the termination region 7 is etched and removed.

Figure 6B:
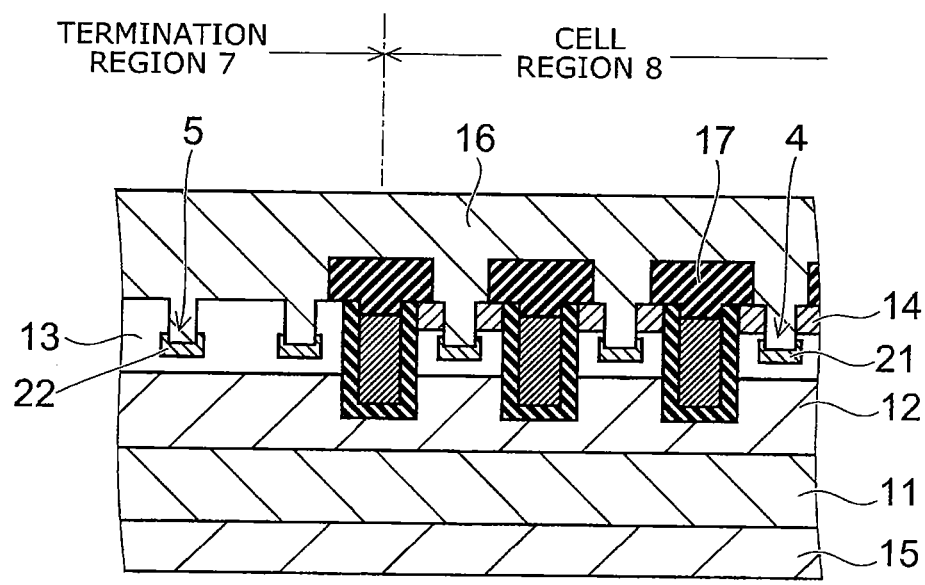

Furthermore, as illustrated in FIG. 6B, the source electrode 16 is formed covering the n-type source region 14, the first contact holes 4 and the interlayer insulating film 17 of the cell region 8, and the p-type base layer 13 and the second contact holes 5 of the termination region 7. Accordingly, in the cell region 8, the source electrode 16 and the p-type base layer 13 are electrically connected via the first contact region 21, and a potential of the p-type base layer 13 is fixed, thus making it possible to stabilize the operation of the MOS-FET 1. In the termination region 7, the source electrode 16 and the p-type base layer 13 are connected in a low resistance connection via the second contact region 22, thus making it possible to reduce resistance to the discharging of holes and enhance the avalanche withstand capability.

Moreover, as illustrated in FIG. 6B, the drain electrode 15 is formed on the second major surface of the n-type drain layer 11. Specifically, the drain electrode 15 is formed by grinding a back surface of the silicon substrate where the MOS-FET 1 is formed, and thinning the substrate, and metalizing the back surface.

Second Embodiment

Figure 7B:
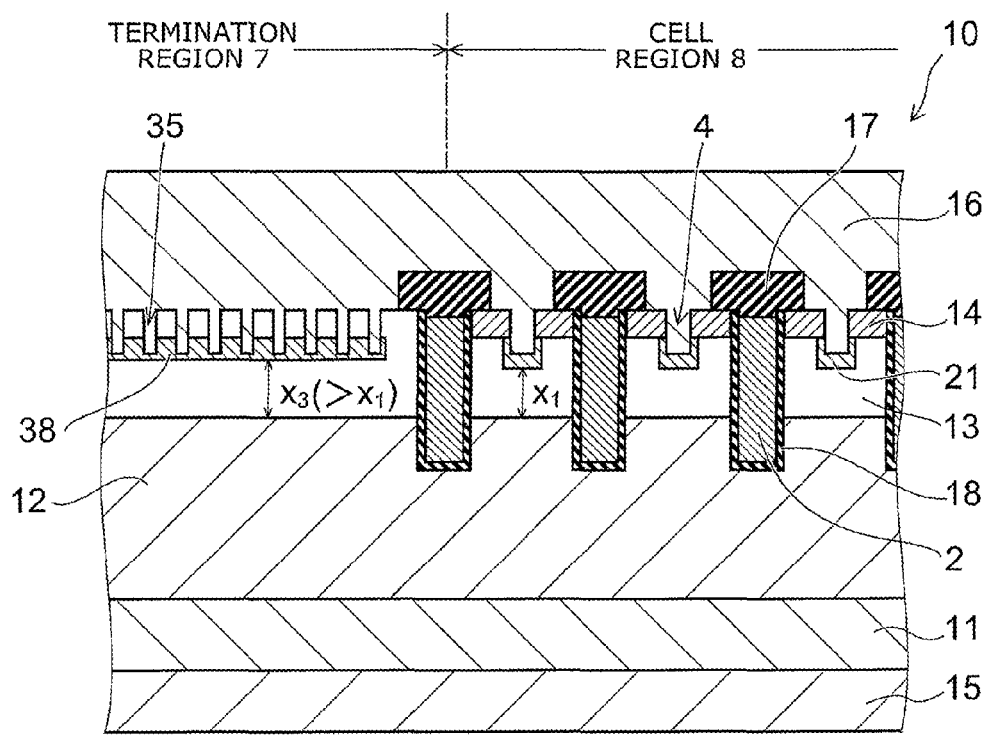

FIGS. 7A and 7B are schematic views illustrating a MOS-FET 10 according to a second embodiment. FIG. 7A is a plan view schematically illustrating a region near the corner portion E of a MOS-FET chip. FIG. 7B is a schematic view illustrating a cross-section taken along the line C-C shown in FIG. 7A.

As illustrated in FIGS. 7A and 7B, the MOS-FET 10 is identical to the MOS-FET 1 described in the first embodiment in that the cell region 8 is provided with unit cells 3 partitioned by trench gates 2, and first contact holes 4 are provided at centers of the unit cells 3.

On the other hand, in the termination portion 7 around the cell region 8, second contact holes 35 having an opening area smaller than that of the first contact holes 4 are provided. Moreover, the second contact holes 35 are provided in higher quantity and at a narrower pitch than a pitch in the MOS-FET 1. Accordingly, the contact resistance between a source electrode 16 and a p-type base layer 13 in a termination region 7 is kept low.

At portions of the termination region 7 adjacent to the corner portion E at which the cell region 8 protrudes outwards, a width of the termination region 7 is wider than at portions of the termination region 7 adjacent to portions of the cell region 8 other than the corner portion E. The second contact holes 35 are formed with the same pitch in the portions adjacent to the corner portion E and in other portions. In short, in the MOS-FET 10 according to this embodiment, the number of second contact holes 35 provided in the termination region 7 adjacent to the corner portion E of the cell region 8 is higher than the number of second, contact holes 35 in the termination region 7 adjacent to portions of the cell region 8 other than the corner portion E. Hence, the resistance between the source electrode 16 and the p-type base layer 13 is further reduced, and the resistance to the discharging of holes is reduced. Accordingly, it is possible to prevent a drop in the avalanche withstand capability by electric field concentration at the corner portion E.

As illustrated in FIG. 7B, since the opening area of the second contact holes 35 is smaller than the opening area of the first contact holes 4, the depth of a second contact region 38 is shallower than a depth of the first contact region 21. Specifically, an interval X3 between the second contact region 38 and a PN junction is wider than an interval X1 between the first contact region 21 and the PN junction.

In the MOS-FET 10 according to this embodiment, the contact resistance between the source electrode 16 and the p-type base layer 13 is reduced by the provision of the numerous second contact holes 35 having small opening areas. Furthermore, by making the second contact region 38 shallow and enhancing the avalanche withstand capability, avalanche breakdowns that occur in the termination region 7 can be suppressed.

Further, as described above, forming the second contact holes 35 with a narrow pitch makes it possible to form the adjacent second contact regions 38 in an integrated manner so that a single contact region is formed, as illustrated in FIG. 7B. Accordingly the contact resistance between the source electrode 16 and the p-type base layer 13 can further reduced and the avalanche withstand capability can be further enhanced. Photolithography can be used to narrow the pitch between the second contact holes 35 to the limit that the shape of the opening pattern can be maintained.

Third Embodiment

Figure 8B:
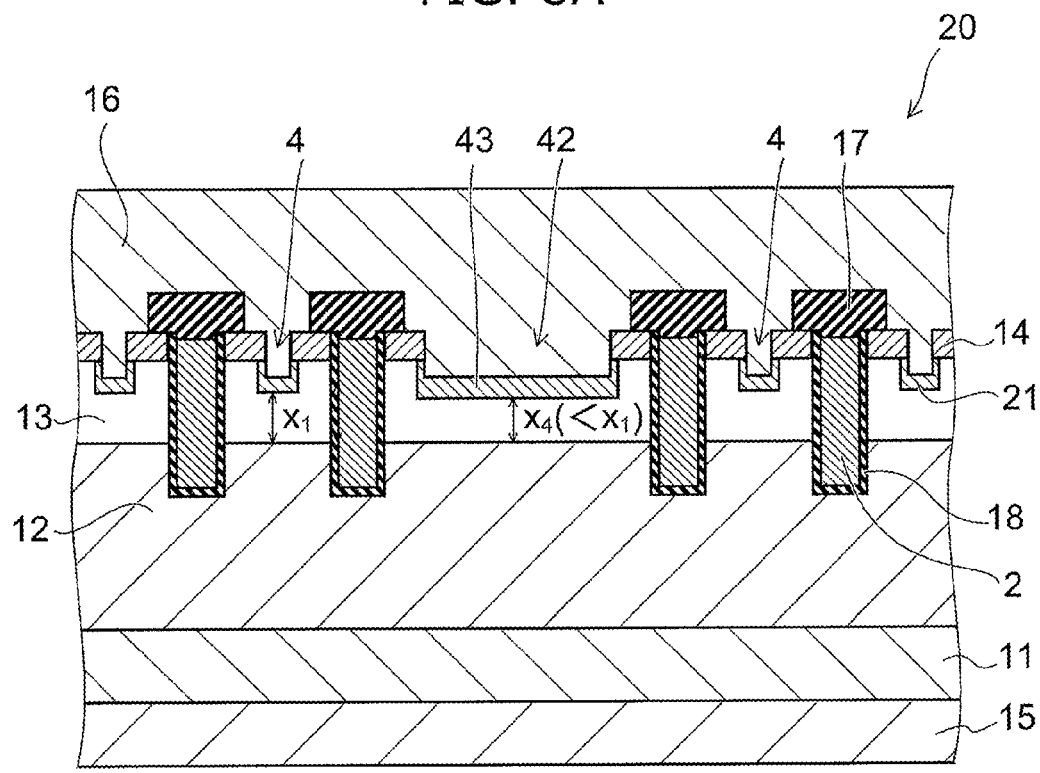

FIGS. 8A and 8B are schematic views illustrating a MOS-FET 20 according to a third embodiment. FIG. 8A is a plan view schematically illustrating the cell region 8 of a MOS-FET chip. FIG. 8B is a schematic view illustrating a cross-section taken along the line D-D shown in FIG. 8A.

As illustrated in FIG. 8A, the MOS-FET 20 according to this embodiment includes, in the cell region 8, a plurality of unit cells 45 provided with a plurality of third contact holes 42, each having a larger opening area than the first contact holes 4. On the other hand, in a termination region not illustrated in the drawing, second contact holes having opening areas that are the same as, or smaller than the first contact holes 4 are provided, the same as described in the first embodiment and the second embodiment.

Moreover, as illustrated in the cross-sectional view of FIG. 8B, the depth in the n-type drain layer 11 direction of a third contact region 43 that is provided at bottoms of the third contact holes 42 is greater than the depth of the first contact region 21 that is provided at bottoms of the first contact holes 4. Specifically, an interval X4 between the third contact region 43 and a PN junction, which is formed at a boundary between the p-type base layer 13 and the n-type drift layer 12, is narrower than the interval X1 between the first contact region 21 and the PN junction.

Hence, the avalanche withstand capability of the unit cells 45 provided with the third contact holes 42 is lower than that of the unit cells 3 provided with the first contact holes 4. On the other hand, the avalanche withstand capability of the termination region is higher than that of the unit cells 3, as described in the first embodiment and the second embodiment. In short, the avalanche withstand capability is lowest in the unit cells 45 where the third contact holes 42 are provided, and avalanche breakdown can occur more easily.

Thus, in the MOS-FET 20 according to this embodiment, avalanche breakdown can be actively caused to occur in the plurality of unit cells 45 disposed in the cell region 8 when excessive voltage is applied at turn off. Accordingly, the avalanche current is diffused and current concentrations are prevented, thus making it possible to avoid destroying the element.

Here, to prevent the avalanche current flowing in the individual unit cells 45 from exceeding the threshold at which the element is destroyed, the number and arrangement of the unit cells 45 provided in the cell region 8 may be optimized using device simulation techniques.

With the MOS-FET 20 according to this embodiment, the avalanche current can be uniformly diffused by optimizing the contact structure between the source electrode 16 and the p-type base layer 13, and device destruction can be effectively avoided. Moreover, because there is no need to increase the number of manufacturing processes to achieve this diffusing, it is possible to improve yield and thus reduce manufacturing costs.

The invention has been described with reference to embodiments of the invention, but the invention is not limited to these embodiments. The design modifications, materials modifications and the like made by a person skilled in the art based on the technological level at the time of the application, and other embodiments using the same technological idea as the invention are to be included in the scope of the invention.

For example, the invention is not limited to the above-described n-channel MOS-FET described in the above embodiments, but can be applied to a p-channel MOS-FET as well. Moreover, the invention is not limited to MOS-FETs that use silicon as a material, but can also be applied to semiconductor devices which use SiC, GaN or the like as a material.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor device, comprising:
a first semiconductor layer of a first conductivity type:
a second semiconductor layer of the first conductivity type, provided on a first major surface of the first semiconductor layer;
a third semiconductor layer of a second conductivity type, provided on the second semiconductor layer;
a source region of the first conductivity type, provided on a surface of the third semiconductor layer;
a first main electrode electrically connected to a second major surface of the first semiconductor layer;
a second main electrode electrically connected to the source region;
trench gates that partition a plurality of unit cells provided in a cell region where a main current flows in a vertical direction between the first main electrode and the second main electrode via the source region, and are provided so as to reach from the surface of the third semiconductor layer to the second semiconductor layer;
a first contact region containing an impurity of the second conductivity type ion implanted at a bottom of each of a plurality of first contact holes formed in the third semiconductor layer at a central portion of each of the plurality of unit cells and electrically connecting the second main electrode and the third semiconductor layer; and
a second contact region containing an impurity of the second conductivity type ion implanted at a bottom of each of a plurality of second contact holes formed in the third semiconductor layer in a termination region provided surrounding the cell region and electrically connecting the second main electrode and the third semiconductor layer, an opening area of each of the second contact holes being smaller than an opening area of each of the first contact holes.

2. The device according to claim 1, wherein an interval between the second semiconductor layer and the second contact region is wider than an interval between the second semiconductor layer and the first contact region.

3. The device according to claim 1, wherein the first contact holes and the second contact holes have an identical depth toward the first semiconductor layer.

4. The device according to claim 1, wherein a pitch of the second contact holes is narrower than a pitch of the first contact holes.

5. The device according to claim 4, wherein the second contact region is provided in a plurality, and the plurality of the second contact regions are connected to one another.

6. The device according to claim 1, further comprising a third contact region containing an impurity of the second conductivity type ion implanted at a bottom of each of a plurality of third contact holes formed in the third semiconductor layer in the cell region and having a larger opening area than the first contact holes, the third contact region electrically connecting the second main electrode and the third semiconductor layer.

7. The device according to claim 6, wherein the first contact holes and the third contact holes have an identical depth toward the first semiconductor layer.

8. The device according to claim 6, wherein an interval between the second semiconductor layer and the third contact region is narrower than an interval between the second semiconductor layer and the first contact region.

9. The device according to claim 6, wherein the plurality of third contact holes are provided to prevent an avalanche current flowing in each of the plurality of unit cells provided with one of the plurality of third contact holes from exceeding a threshold causing element destruction.

10. A semiconductor device, comprising:
a first semiconductor layer of a first conductivity type:
a second semiconductor layer of the first conductivity type, provided on a first major surface of the first semiconductor layer;
a third semiconductor layer of a second conductivity type, provided on the second semiconductor layer;
a source region of the first conductivity type, provided on a surface of the third semiconductor layer;
a first main electrode electrically connected to a second major surface of the first semiconductor layer;
a second main electrode electrically connected to the source region;
trench gates that partition a plurality of unit cells provided in a cell region where a main current flows in a vertical direction between the first main electrode and the second main electrode via the source region and are provided so as to reach from the surface of the third semiconductor layer to the second semiconductor layer;
a first contact region containing an impurity of the second conductivity type ion implanted at a bottom of each of a plurality of first contact holes formed in the third semiconductor layer at a central portion of each of the plurality of unit cells and electrically connecting the second main electrode and the third semiconductor layer; and
a second contact region containing an impurity of the second conductivity type ion implanted at a bottom of each of a plurality of second contact holes formed in the third semiconductor layer in a termination region provided surrounding the cell region and electrically connecting the second main electrode and the third semiconductor layer, an opening area of each of the second contact holes being equal to an opening area of each of the first contact holes.

11. The device according to claim 10, further comprising a third contact region containing an impurity of the second conductivity type ion implanted at a bottom of each of a plurality of third contact holes formed in the third semiconductor layer in the cell region and having a larger opening area than the first contact holes, the third contact region electrically connecting the second main electrode and the third semiconductor layer.

12. The device according to claim 11, wherein an interval between the second semiconductor layer and the third contact region is narrower than an interval between the second semiconductor layer and the first contact region.

13. The device according to claim 11, wherein the plurality of third contact holes are provided to prevent an avalanche current flowing in each of the plurality of unit cells provided with one of the plurality of third contact holes from exceeding a threshold causing element destruction.

14. A semiconductor device, comprising:
a first semiconductor layer of a first conductivity type:
a second semiconductor layer of the first conductivity type, provided on a first major surface of the first semiconductor layer;
a third semiconductor layer of a second conductivity type, provided on the second semiconductor layer;
a source region of the first conductivity type, provided on a surface of the third semiconductor layer;

a first main electrode electrically connected to a second major surface of the first semiconductor layer;

a second main electrode electrically connected to the source region;

trench gates that partition a plurality of unit cells provided in a cell region where a main current flows in a vertical direction between the first main electrode and the second main electrode via the source region and are provided so as to reach from the surface of the third semiconductor layer to the second semiconductor layer;

a first contact hole formed in the third semiconductor layer at a central portion of each of the unit cells; and a second contact hole formed in the third semiconductor layer in a termination region provided surrounding the cell region, an opening area of the second contact hole being smaller than or equal to an opening area of the first contact hole.

15. The device according to claim 14, further comprising:

a first contact region containing an impurity of the second conductivity type ion implanted at a bottom of the first contact hole; and a second contact region containing an impurity of the second conductivity type ion implanted at a bottom of the second contact hole, wherein an interval between the second semiconductor layer and the second contact region is wider than an interval between the second semiconductor layer and the first contact region.

16. The device according to claim 15, wherein the second contact region is provided in a plurality, and the plurality of the second contact regions are connected to one another.

17. The device according to claim 15, further comprising a third contact region containing an impurity of the second conductivity type ion implanted at a bottom of each of a plurality of third contact holes formed in the third semiconductor layer in the cell region and having a larger opening area than the first contact holes, the third contact region electrically connecting the second main electrode and the third semiconductor layer.

18. The device according to claim 17, wherein the first contact holes and the third contact holes have an identical depth toward the first semiconductor layer.

19. The device according to claim 17, wherein an interval between the second semiconductor layer and the third contact region is narrower than an interval between the second semiconductor layer and the first contact region.

20. The device according to claim 14, wherein the first contact holes and the second contact holes have an identical depth toward the first semiconductor layer.

* * * * *